United States Patent [19]
Jacobs

[11] Patent Number: 6,124,748
[45] Date of Patent: Sep. 26, 2000

[54] METHOD AND APPARATUS FOR IMPROVING RINGBACK TOLERANCE IN AN INPUT RECEIVER

[75] Inventor: Jason P. Jacobs, Rancho Cordova, Calif.

[73] Assignee: Intel Corporation, Santa Clara, Calif.

[21] Appl. No.: 09/289,053

[22] Filed: Apr. 9, 1999

[51] Int. Cl.[7] .......................... H03K 17/16; H03K 17/30
[52] U.S. Cl. .............................................. 327/379; 327/206
[58] Field of Search .................................... 327/112, 205, 327/206, 225, 323, 379, 384, 387, 389; 326/23, 24, 26, 27, 83, 87

[56] References Cited

U.S. PATENT DOCUMENTS

| | | | |
|---|---|---|---|
| 4,818,901 | 4/1989 | Young et al. ............................... | 326/27 |
| 5,698,994 | 12/1997 | Tsuji ........................................... | 326/83 |
| 5,886,556 | 3/1999 | Ganger et al. ............................ | 327/206 |
| 6,037,827 | 3/2000 | Fisch ......................................... | 327/379 |

*Primary Examiner*—My-Trang Nuton
*Attorney, Agent, or Firm*—Blakely, Sokoloff, Taylor & Zafman LLP

[57] ABSTRACT

An embodiment of a ringback tolerant input buffer in a receiving device is disclosed. The input buffer includes circuitry to provide positive feedback to an input signal once the input signal has crossed a reference voltage threshold. The positive feedback prevents the input signal from recrossing the reference voltage threshold until the receiving device has sampled the input signal. The positive feedback is applied only until the input signal is sampled into the receiving device.

16 Claims, 4 Drawing Sheets

METHOD AND APPARATUS FOR IMPROVING RINGBACK TOLERANCE IN AN INPUT RECEIVER

FIELD OF THE INVENTION

The present invention pertains to the field of computer systems. More particularly, this invention pertains to the field of improving ringback tolerance in input receivers.

BACKGROUND OF THE INVENTION

As the clock rates of computer system interconnect busses increase in order to generate greater system performance, signal integrity issues become more important. An example of a typical signal integrity issue is illustrated in FIG. 1. An input voltage 115 typifies a voltage as seen at a receiving device on a high speed bus. For this example, the input voltage 115 is considered in a logically high state when above a reference voltage 110. The input voltage 115 is considered in a logically low state when below the reference voltage 110. The input voltage 115 is making a transition from the logically low state to the logically high state.

However, as can be seen in the figure, the waveform for the input voltage 115 does not make a smooth transition from the logically low state to the logically high state. The distortion is due to reflections, or ringback, on the transmission line carrying the input voltage 115. The particular distortion displayed in this example poses a particular problem in that the waveform dips below the reference voltage 110 after first crossing the reference voltage from low to high at time A. If the receiving device were to sample the input voltage when the input voltage dips below the reference voltage 115, the receiving device would see a logically low voltage level instead of the intended logically high voltage level.

One technique for solving the ringback problem described above is to not allow the receiving device to sample the input voltage 115 until the input voltage 115 crosses the reference voltage from low to high at time C at the earliest. This can be accomplished by selecting a system clock period that is long enough to allow the input voltage waveform to settle before the receiving device samples the input voltage 115. By waiting until the ringback condition settles before sampling, the receiving device can be assured that the input voltage 115 is in the proper state. However, this technique has a drawback in that by elongating the clock period, system performance is degraded. In the absence of ringback, the clock period would be set so that the receiving device would sample the input voltage as soon as the input voltage 115 made its first low to high transition across the reference voltage 110 at time A.

An alternative to elongating the clock period is reducing the distance the input voltage 115 must travel between the transmitting device and the receiving device. This alternative places difficult restrictions on motherboard manufacturers as it becomes increasingly difficult to manufacture motherboards when very short signal trace lengths are required.

Another technique that may be used to try to solve the ringback problem is to use a Schmitt trigger on the input signal. For this example, a Schmitt trigger will allow the receiving device to see a logically high voltage level once the input voltage 115 crosses a Schmitt trigger level 120 at time B. While the Schmitt trigger solution allows a reduction in clock period equal to the time interval between points B and C, the Schmitt trigger solution still has the disadvantage of requiring the receiving device to wait until at least time B before sampling the input voltage 115. Therefore, the clock period must be increased by an amount of time equal to the period between time A and time B over the ideal case in order to allow the input voltage 115 time to reach the Schmitt trigger level 120 and to ensure that the receiving device will sample a valid input voltage state.

SUMMARY OF THE INVENTION

A method and apparatus for improving ringback tolerance in an input receiver is disclosed. The apparatus includes a first receiver stage to receive an input signal. The first receiver stage includes an input and an output. The apparatus further includes a second receiver stage having an input and an output. The input of the second receiver stage is coupled to the output of the first receiver stage. A flip-flop having an input and an output is also included. The input of the flip-flop is coupled to the output of the second receiver stage. Also included is a positive feedback circuit having an output and a first input. The output of the positive feedback circuit is coupled to the input of the second receiver stage. The first input of the positive feedback circuit is coupled to the output of the second receiver stage. The positive feedback circuit applies positive feedback to the input of the second receiver stage after a voltage level at the output of the second receiver stage transitions from a first logical voltage level to a second logical voltage level. The positive feedback circuit ceases to apply positive feedback to the input of the second receiver stage after a voltage at the output of the flip-flop transitions from the first logical voltage level to the second logical voltage level.

BRIEF DESCRIPTION OF THE DRAWINGS

The invention is illustrated by way of example and not limitation in the figures of the accompanying drawings, in which like references indicate similar elements, and in which.

DETAILED DESCRIPTION

An embodiment of a ringback tolerant input buffer in a receiving device is disclosed. The input buffer includes circuitry to provide positive feedback to an input signal once the input signal has crossed a reference voltage threshold. The positive feedback prevents the input signal from recrossing the reference voltage threshold until the receiving device has sampled the input signal. The positive feedback is applied only until the input signal is sampled into the receiving device. This example embodiment is intended to allow system device interconnect busses to operate at greater clock frequencies than would otherwise be possible. The embodiment is further intended to allow motherboard manufacturers greater freedom in routing signal traces on motherboards.

Figure 1:
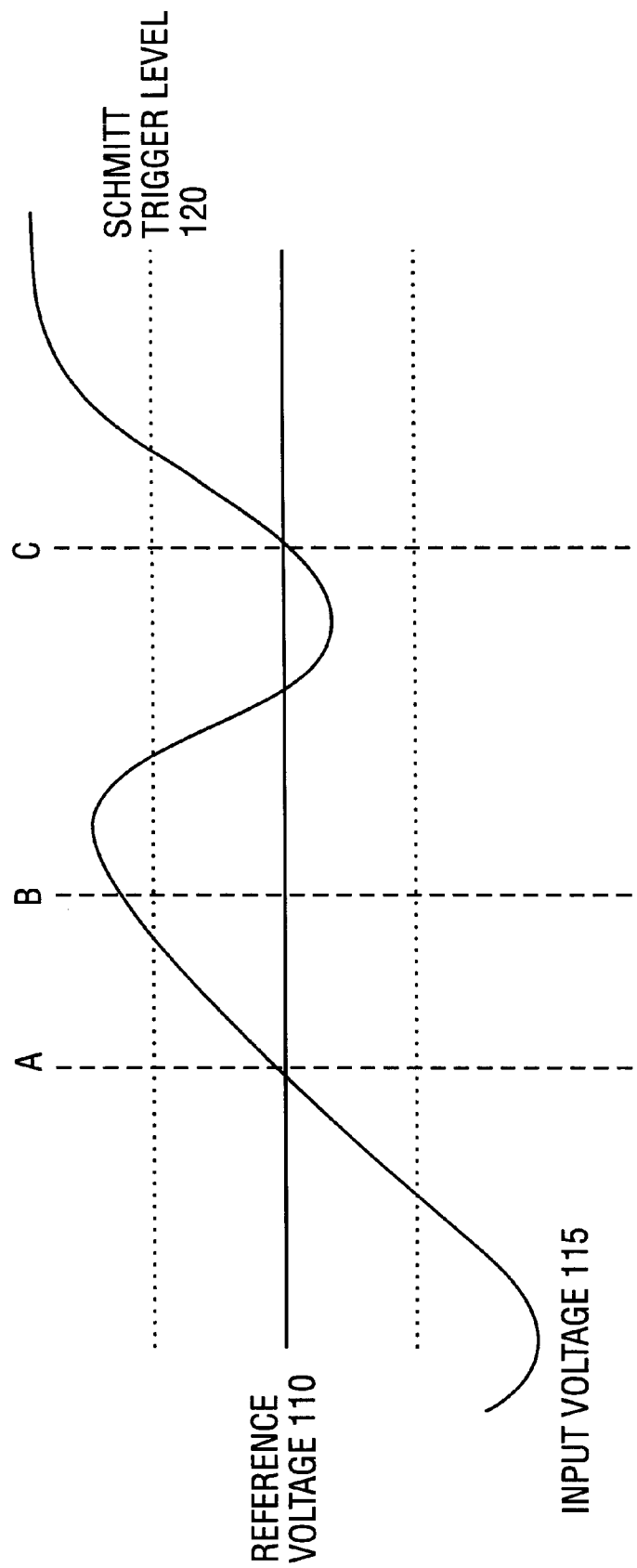
FIG. 1 is an example waveform of a signal demonstrating ringback problems.
Figure 2:
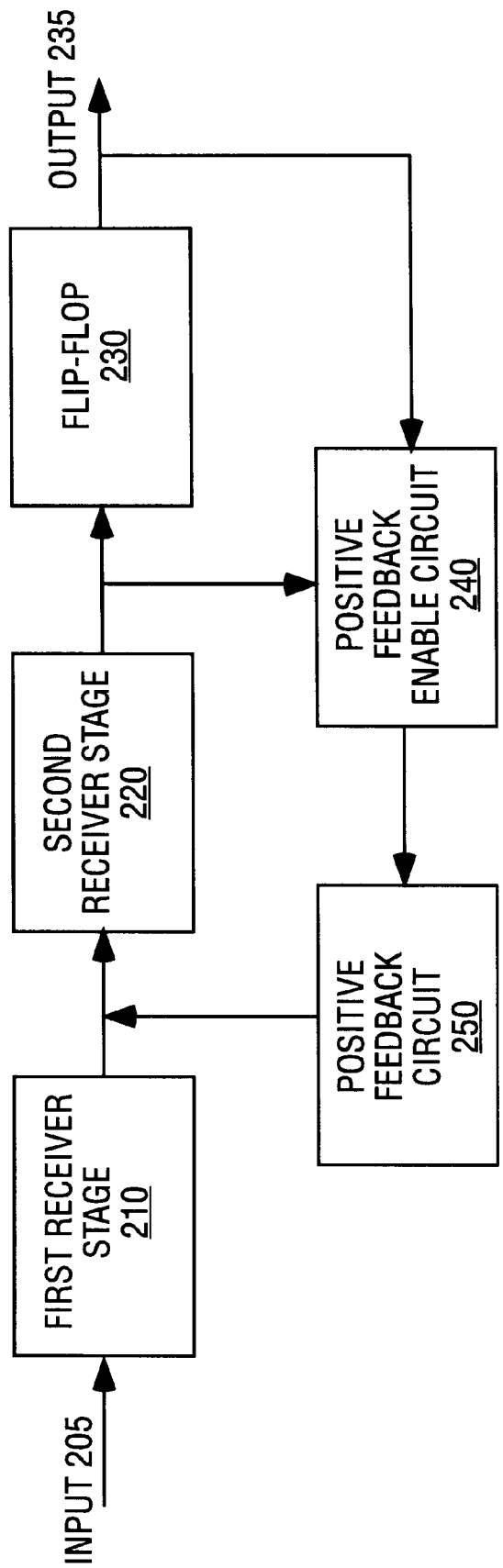
FIG. 2 is a block diagram of one embodiment of a ringback tolerant input receiver.

FIG. 2 shows a block diagram of one embodiment of a ringback tolerant input receiver. An input signal 205 is received by a first receiver stage 210. The first receiver stage 210 may include an inverting comparator circuit. The input signal 205 is transmitted by the first receiver 210 to a second receiver stage 220. The second receiver stage 220 may include an inverter circuit. The input receiver of FIG. 2 also includes a flip-flop 230, a positive feedback circuit 250, and a positive feedback enable circuit 240.

In general, the input receiver of FIG. 2 functions in the following manner for an input signal transition from a logically low state to a logically high state. When the input signal 205 begins to move from a low state to a high state, the output of the second receiver stage 220 will also begin to move from a low state to a high state. Because the input signal 205 was previously at a low state, the output of the flip-flop 230, represented by an output signal 235, remains at a low state until a new value is sampled at a later time. When the output of the second receiver stage 220 enters a logically high state and the output signal 235 is at a low state, the positive feedback enable circuit 240 indicates to the positive feedback circuit 250 to apply positive feedback to the input of the second receiver stage 220.

If the first receiver stage 210 is implemented using an inverting comparator and if the second receiver stage 220 is implemented using an inverter, then the positive feedback circuit pulls the input of the second receiver stage 220 towards a voltage level of 0 V. This positive feedback will prevent the input of the second receiver stage 220 from transitioning from low to high even if the input signal 205 is experiencing ringback. The lack of ringing at the input to the second receiver stage 220 means that the flip-flop 230 will also have a valid signal as its input.

When the flip-flop 230 samples the signal at its input, the state of the output signal 235 will transition from low to high. When the output signal 235 is high and the output of the second receiver stage 220 is also high, the positive feedback enable circuit 240 will indicate to the positive feedback circuit 250 to cease applying the positive feedback to the input of the second receiver stage 220. When no positive feedback is being applied, the second receiver stage is prepared to react to a change of state of the input signal 205.

When the input signal 205 begins to return from the high state to the low state, the output of the second receiver stage 220 will also begin to move from a high state to a low state. The output of the flip-flop 230, represented by the output signal 235, remains at a high state until a new value is sampled at a later time. When the output of the second receiver stage 220 enters a logically low state and the output signal 235 is at a high state, the positive feedback enable circuit 240 indicates to the positive feedback circuit 250 to apply positive feedback to the input of the second receiver stage 220.

If the first receiver stage 210 is implemented using an inverting comparator and if the second receiver stage 220 is implemented using an inverter, then the positive feedback circuit pulls the input of the second receiver stage 220 towards a positive supply voltage level. One embodiment uses a positive supply voltage of 1.5 V. Other embodiments may use different supply voltage levels. This positive feedback will prevent the input of the second receiver stage 220 from transitioning from high to low even if the input signal 205 is experiencing ringback.

When the flip-flop 230 samples the signal at its input, the state of the output signal 235 will transition from high to low. When the output signal 235 is low and the output of the second receiver stage 220 is also low, the positive feedback enable circuit 240 will indicate to the positive feedback circuit 250 to cease applying the positive feedback to the input of the second receiver stage 220. As discussed above, when no positive feedback is being applied, the second receiver stage is prepared to react to a change of state of the input signal 205.

The term "flip-flop" as used herein is intended to include a broad range of circuitry whose output does not change in value until new data is sampled. Further, although the above embodiment discusses the positive feedback circuit providing positive feedback only when the voltages at the output of the flip-flop 230 and the output of the second receiver stage 220 are at different logical voltage levels, other embodiments may include any circuitry that provides positive feedback after the voltage at the output of the second receiver stage transitions from one logical voltage state to another logical voltage state and ceases to apply positive feedback once data has been sampled.

Figure 3:
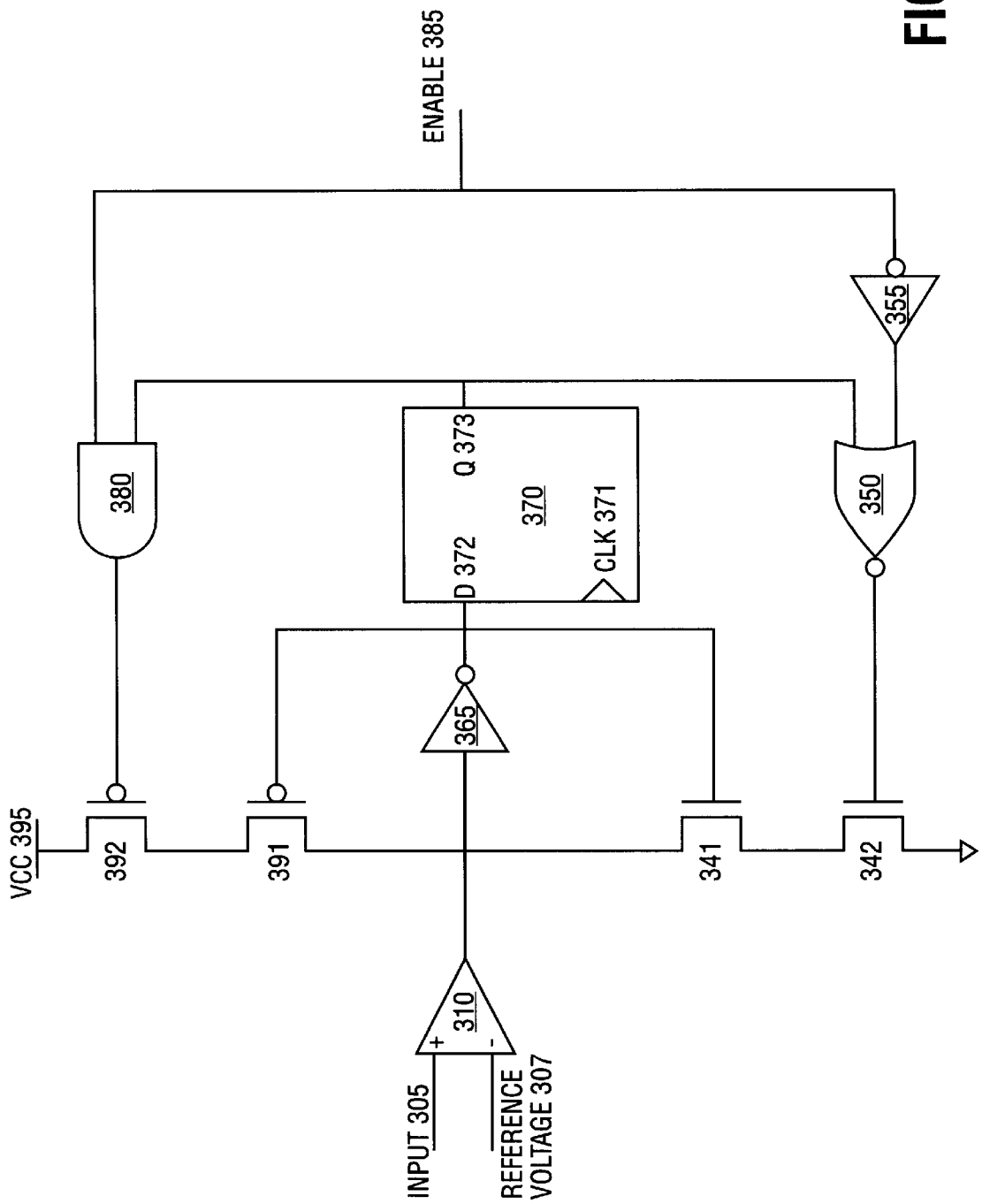
FIG. 3 is a circuit diagram of one embodiment of a ringback tolerant input receiver.

FIG. 3 is a circuit diagram of one embodiment of a ringback tolerant input receiver. An input signal 305 is received at a positive input of a comparator circuit 310. The comparator circuit 310 compares the voltage of the input signal 305 with a reference voltage 307 that is received at a negative input of the comparator circuit 310. When the input signal 305 voltage is more positive than the reference voltage 307, the comparator circuit 310 will output a logically low voltage level. When the input signal 305 voltage is more negative than the reference voltage 307, the comparator circuit 310 will output a logically high voltage level. The function of the remainder of the example embodiment will be explained first in the context of a low to high transition of the input signal 305.

When the input signal 305 first rises above the reference voltage 307, the comparator will output a logically low voltage level. This logically low voltage level is received at the input of an inverter 365. The inverter 365 outputs a logically high voltage level, which is received at an input 372 of a flip-flop 370 and at the gate of a transistor 341. The flip-flop 370 is clocked via a CLK input 371, which receives a sample signal (not shown). Until the flip-flop 370 samples new data, the output 373 of the flip-flop 370 will maintain a logically low voltage level, which was the last data that was previously sampled. The output 373 of the flip-flop 370 is delivered to an input of a NOR gate 350 and to an input of a NAND gate 380. An enable signal 385 is also delivered to an input of the NAND gate 380. An inverted version of the enable signal 385 is delivered to an input of the NOR gate 350 via an inverter 355.

When the output 373 of the flip-flop 370 is at a low state and the enable signal 385 is enabled, the output of the NOR gate 350 drives a logically high voltage level to the gate of a transistor 342. The logically high voltage level applied to the gate of the transistor 342 turns on the transistor 342 and provides a path between a transistor 341 and ground. The transistor 341 also has a logically high voltage level applied to its gate which turns on the transistor 341. Therefore, a path is provided between the input of the inverter 365 and ground. Because of this path to ground, even if the input signal 305 tries to dip back below the reference voltage level, the input of the inverter 365 will remain in a logically low state. This will in turn provide the flip-flop 370 with a stable input at a logically high voltage level that can be sampled with confidence.

Once the logically high voltage level is sampled at the flip-flop 370, the output 373 of the flip-flop 370 will deliver a logically high voltage level to the input of the NOR gate 350. When the NOR gate 350 receives a logically high voltage level from the output 373 of the flip-flop 370, the output of the NOR gate 350 will drive a logically low voltage level to the gate of the transistor 342, thereby turning off the transistor 342 and removing the path to ground. The elimination of the path to ground removes the positive feedback effect, and the input of the inverter 365 is now prepared to react to transitions of the input signal 305.

The function of the current example embodiment will now be discussed in connection with a transition of the input signal 305 from a logically high voltage level to a logically low voltage level.

When the input signal 305 first falls below the reference voltage 307, the comparator will output a logically high voltage level. This logically high voltage level is received at the input of the inverter 365. The inverter 365 outputs a logically low voltage level, which is received at the input 372 of the flip-flop 370 and at the gate of a transistor 391. Until the flip-flop 370 samples new data, the output 373 of the flip-flop 370 will maintain a logically high voltage level, which was the last data that was previously sampled.

When the output 373 of the flip-flop 370 is at a high state and the enable signal 385 is enabled, the output of the NAND gate 380 drives a logically low voltage level to the gate of a transistor 392. The logically low voltage level applied to the gate of the transistor 392 turns on the transistor 392 and provides a path between a transistor 391 and a supply voltage (VCC) 395. For this example embodiment, the supply voltage VCC 395 has a value of approximately 1.5 V, although alternative embodiments may use different supply voltages. The transistor 391 also has a logically low voltage level applied to its gate which it receives from the output of the inverter 365. The output of the inverter 365 turns on the transistor 391, thereby providing a path between the input of the inverter 365 and VCC 395. Because of this path to VCC 395, even if the input signal 305 tries to rise back above the reference voltage level, the input of the inverter 365 will remain in a logically high state. This will in turn provide the flip-flop 370 will a stable input at a logically low voltage level.

Once the logically low voltage level is sampled at the flip-flop 370, the output 373 of the flip-flop 370 will deliver a logically low voltage level to the input of the NAND gate 380. When the NAND gate 380 receives a logically low voltage level from the output 373 of the flip-flop 370, the output of the NOR gate 350 will drive a logically high voltage level to the gate of the transistor 342, thereby turning off the transistor 342 and removing the path to VCC 395. The elimination of the path to VCC 395 removes the positive feedback effect, and the input of the inverter 365 is now prepared to react to transitions of the input signal 305.

The enable signal 385 serves as a means to disable the positive feedback feature. When the enable signal 385 is deasserted, the NAND gate 380 will drive a logically high voltage level to the transistor 392, thereby eliminating the path to VCC 395 independent of the value of the output 373 of the flip-flop 370. Similarly, when the enable signal 385 is deasserted, the NOR gate 350 will drive a logically low voltage level to the transistor 342, thereby eliminating the path to ground independent of the output of the flip-flop 370.

Figure 4:
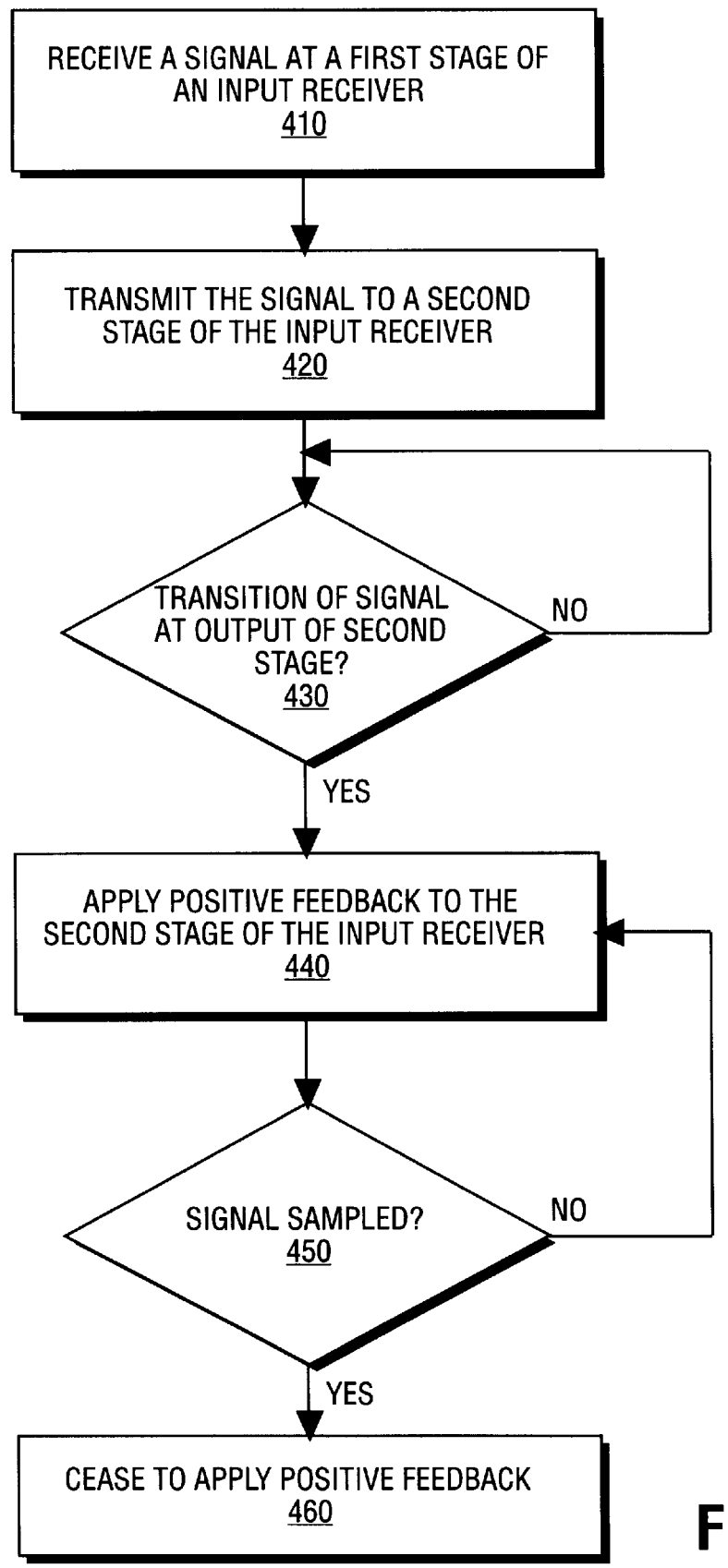
FIG. 4 is a flow diagram of one embodiment of a method for improving ringback tolerance in an input receiver.

FIG. 4 is a flow diagram of an embodiment for improving ringback tolerance in an input receiver. At step 410, a signal is received at a first stage of an input receiver. The signal is transmitted to a second stage of the input receiver at step 420. If there is a transition of the signal at the output of the second stage at step 430, then positive feedback in applied to the second stage of the input receiver at step 440. If there is no transition of the signal at step 430, then step 430 is repeated. At step 450, a determination is made whether the signal has been sampled at the output of the second stage. If the signal has not been sampled, then the application of positive feedback continues at step 440. If, however, the signal has been sampled at step 450, the positive feedback is halted at step 460.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:

a first receiver stage to receive an input signal, the first receiver stage having an input and an output;

a second receiver stage having an input and an output, the input of the second receiver stage coupled to the output of the first receiver stage;

a flip-flop having an input and an output, the input of the flip-flop coupled to the output of the second receiver stage; and a positive feedback circuit having an output and a first input, the output of the positive feedback circuit coupled to the input of the second receiver stage, the first input of the positive feedback circuit coupled to the output of the second receiver stage, the positive feedback circuit to apply positive feedback to the input of the second receiver stage after a voltage level at the output of the second receiver stage transitions from a first logical voltage level to a second logical voltage level, the positive feedback circuit to cease applying positive feedback to the input of the second receiver stage after a voltage at the output of the flip-flop transitions from the first logical voltage level to the second logical voltage level.

2. The apparatus of claim 1 wherein the positive feedback circuit includes a second input, the second input of the positive feedback circuit coupled to the output of the flip-flop, the positive feedback circuit to apply positive feedback to the input of the second receiver stage when the second logical voltage level exists at the output of the second receiver stage and the first logical voltage level exists at the output of the flip-flop.

3. The apparatus of claim 1, wherein the first receiving stage includes an inverting comparator circuit having a reference voltage input.

4. The apparatus of claim 3, wherein the second receiving stage includes an inverter.

5. The apparatus of claim 4, further comprising a positive feedback enable circuit coupled between the output of the flip-flop and the positive feedback circuit.

6. The apparatus of claim 5, wherein the positive feedback enable circuit includes a NAND gate having a first input, a second input, and an output, and a NOR gate having a first input, a second input, and an output, and an enable signal inverter having an input and an output, the first input of the NAND gate coupled to the output of the flip-flop and the second input of the NAND gate to receive an enable signal, the first input of the NOR gate coupled to the output of the flip-flop and the second input of the NOR gate coupled to the output of the enable signal inverter, the input of the enable signal inverter to receive the enable signal.

7. The apparatus of claim 6, wherein the positive feedback circuit includes a first p-type transistor, a second p-type transistor, a first n-type transistor, and a second n-type transistor, the first p-type transistor coupled between the input of the second receiver stage and the second p-type transistor, a gate of the first p-type transistor coupled to the output of the second receiver stage, the second p-type transistor coupled between the first p-type transistor and a first supply voltage, a gate of the second p-type transistor coupled to the output of the NAND gate, the first n-type transistor coupled between the input of the second receiver stage and the second n-type transistor, a gate of the first n-type transistor coupled to the output of the second receiver stage, the second n-type transistor coupled between the first n-type transistor and a second supply voltage, a gate of the second n-type transistor coupled to the output of the NOR gate.

8. The apparatus of claim 7, wherein the first supply voltage is approximately 1.5 V and the second supply voltage is approximately 0 V.

9. The apparatus of claim 8, the reference voltage input to receive a voltage of approximately 1.0 V.

10. An apparatus, comprising:

first receiving stage means for receiving an input signal, the first receiver stage means having an input and an output;

second receiver stage means for receiving the output of the first receiving stage means, the second receiver stage means having an input and an output;

sampling means for sampling the output of the second receiving stage means, the sampling means having an input and an output; and means for providing positive feedback, the means for providing positive feedback having an output and a first input, the output of the means for providing positive feedback coupled to the input of the second receiver stage means, the first input of the means for providing positive feedback coupled to the output of the second receiver stage, the means for providing positive feedback to apply positive feedback to the input of the second receiver stage means after a voltage level at the output of the second receiver stage means transitions from a first logical voltage level to a second logical voltage level, the means for providing positive feedback to cease applying positive feedback to the input of the second receiver stage means after a voltage at the output of the sampling means transitions from the first logical voltage level to the second logical voltage level.

11. The apparatus of claim 10, wherein the first receiving stage means includes means for comparing an input signal with a reference voltage and means for amplifying the difference between the input signal and the reference voltage.

12. The apparatus of claim 11, wherein the second receiving stage means includes means for inverting the output of the first receiving stage means.

13. The apparatus of claim 12, further comprising means for enabling the positive feedback means.

14. A method, comprising:

receiving a signal at a first stage of an input receiver;

transmitting the signal to a second stage of the input receiver;

applying positive feedback to the second stage of the input receiver upon a transition of the signal at the output of the second stage of the input receiver from a first logical state to a second logical state;

sampling the signal at the output of the second stage of the input receiver; and ceasing to apply positive feedback once the signal has been sampled.

15. The method of claim 14, wherein applying positive feedback to the second stage of the input receiver includes enabling a first transistor, the first transistor coupling the input of the second stage of the input receiver to a supply voltage.

16. The method of claim 15, wherein ceasing to apply positive feedback once the signal has been sampled includes disabling a second transistor coupled between the first transistor and the supply voltage.

* * * * *